US012691631B2

(12) United States Patent　　　(10) Patent No.:　US 12,691,631 B2

Sato　　　　　　　　　　　　　　　(45) Date of Patent:　　Jul. 28, 2026

(54) IMPRINT APPARATUS, IMPRINT METHOD AND ARTICLE MANUFACTURING METHOD

(71) Applicant: CANON KABUSHIKI KAISHA, Tokyo (JP)

(72) Inventor: Takahiro Sato, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 45 days.

(21) Appl. No.: 18/671,177

(22) Filed: May 22, 2024

(65) Prior Publication Data

US 2024/0399648 A1　　Dec. 5, 2024

(30) Foreign Application Priority Data

Jun. 1, 2023　(JP) ................................. 2023-091031

(51) Int. Cl.
　B29C 59/02　　　(2006.01)
　B29C 59/00　　　(2006.01)
　G03F 7/00　　　(2006.01)
(52) U.S. Cl.
　CPC .......... B29C 59/022 (2013.01); B29C 59/002 (2013.01); G03F 7/0002 (2013.01)
(58) Field of Classification Search
　None
　See application file for complete search history.

(56) References Cited

U.S. PATENT DOCUMENTS

| 7,906,058 | B2 | 3/2011 | Ganapathisubramanian et al. |
| 2013/0037981 | A1* | 2/2013 | Tanaka ................... B82Y 40/00 |
| | | | 264/40.5 |
| 2016/0297136 | A1* | 10/2016 | Wakabayashi .......... B29C 64/00 |

FOREIGN PATENT DOCUMENTS

| JP | 5543502 | B2 | 7/2014 |
| JP | 2017050428 | A | 3/2017 |
| JP | 2017103430 | A | 6/2017 |
| JP | 2018093122 | A | 6/2018 |
| KR | 1020160031436 | A | 3/2016 |
| KR | 1020160121433 | A | 10/2016 |
| KR | 1020180048912 | A | 5/2018 |

OTHER PUBLICATIONS

1 Office Action issued in Japanese Appln. No. 2023-091031 mailed May 16, 2025.

* cited by examiner

*Primary Examiner* — Armand Melendez
(74) *Attorney, Agent, or Firm* — ROSSI, KIMMS & McDOWELL LLP

(57)　　　　　　ABSTRACT

An imprint apparatus including a mold holding unit configured to hold a mold, a deformation unit configured to deform a pattern surface of the mold by adjusting a pressure of a closed space defined between a surface of the mold opposite to the pattern surface and the mold holding unit in a state in which the mold is held by the mold holding unit, and a control unit configured to control a shape of the pattern surface by adjusting the pressure of the closed space by the deformation unit in accordance with a position of a shot region to make the shape of the pattern surface conform to a surface shape of the shot region when forming the pattern in each of a plurality of shot regions.

9 Claims, 12 Drawing Sheets

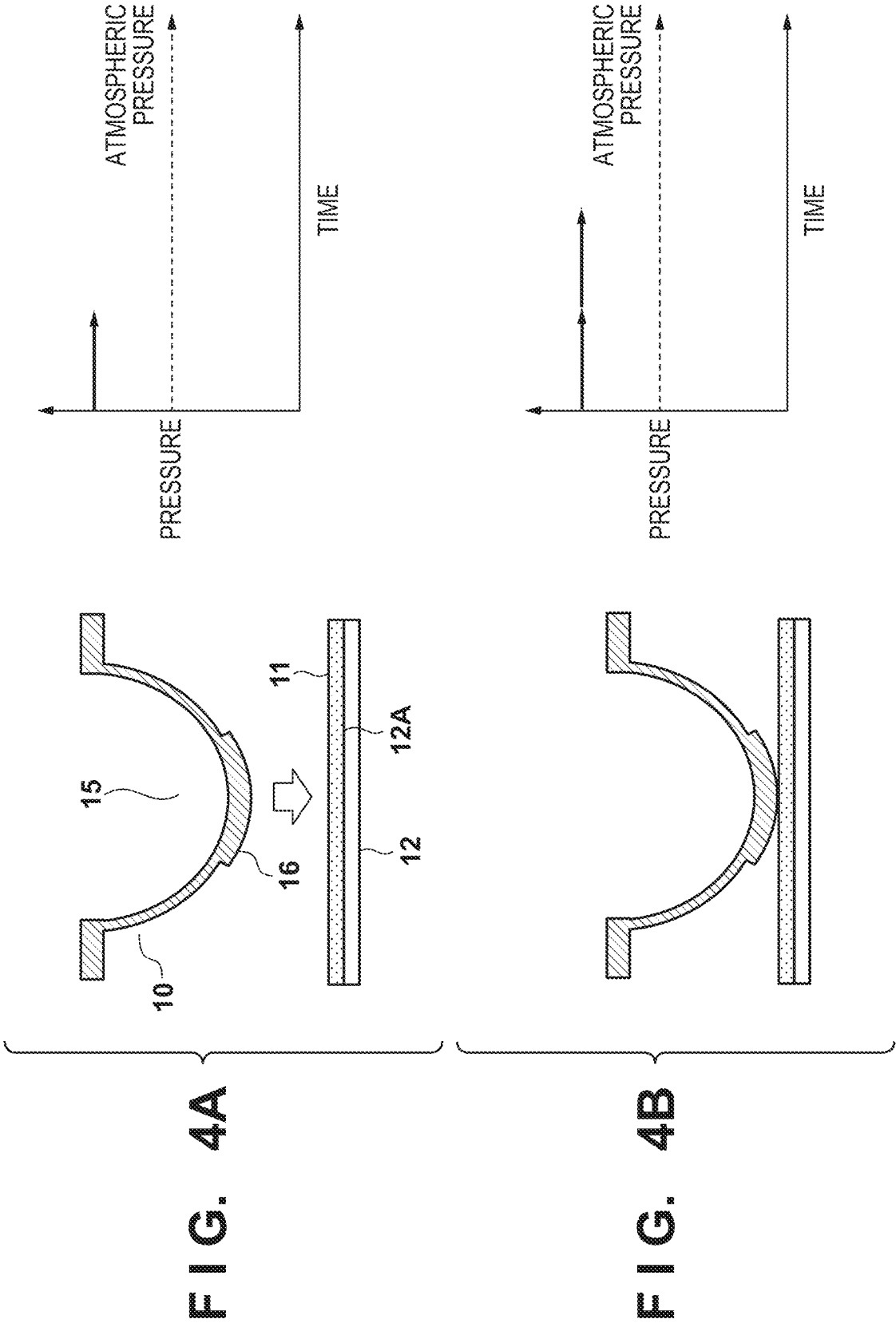

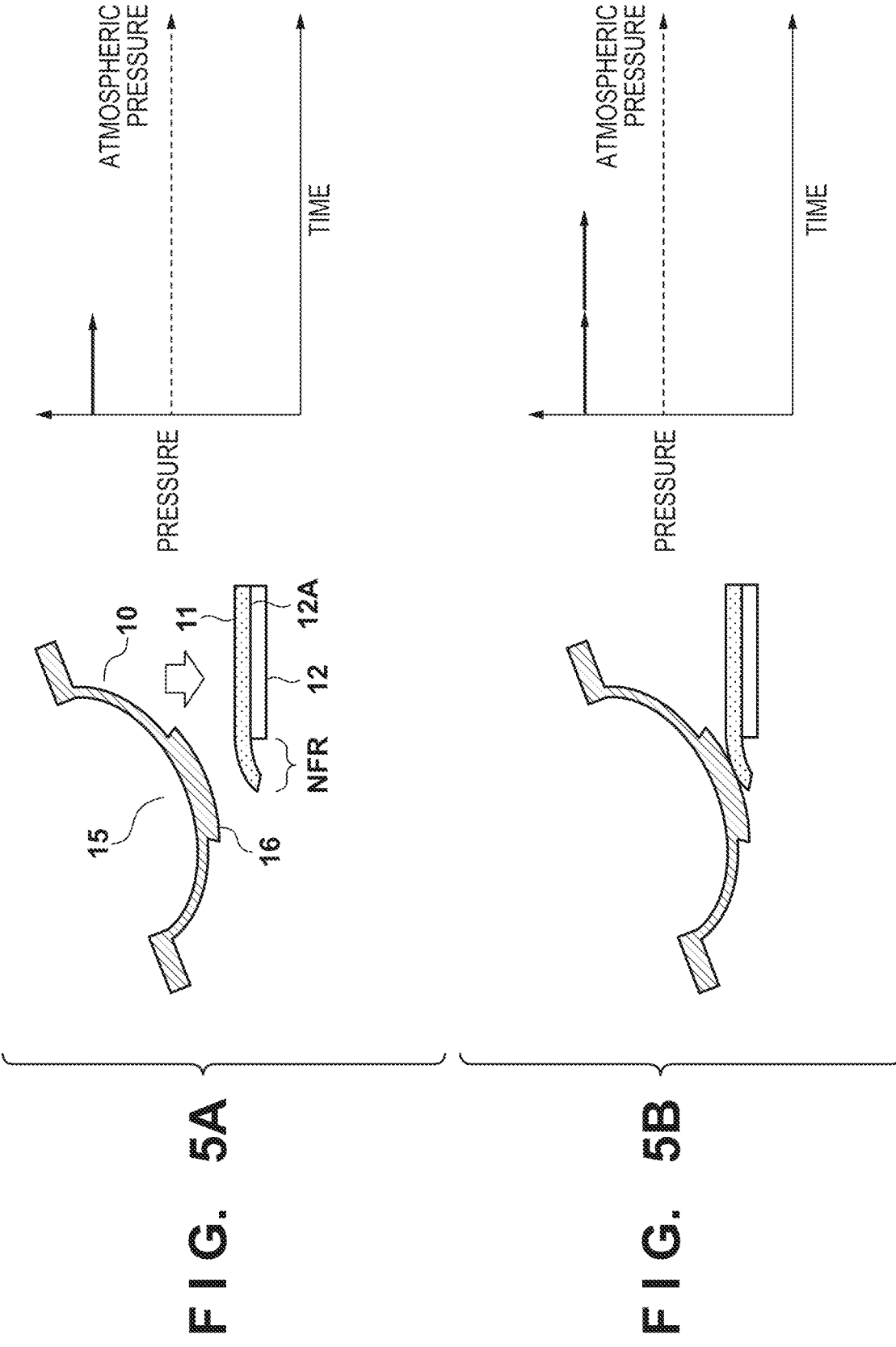
F I G. 5A
F I G. 5B

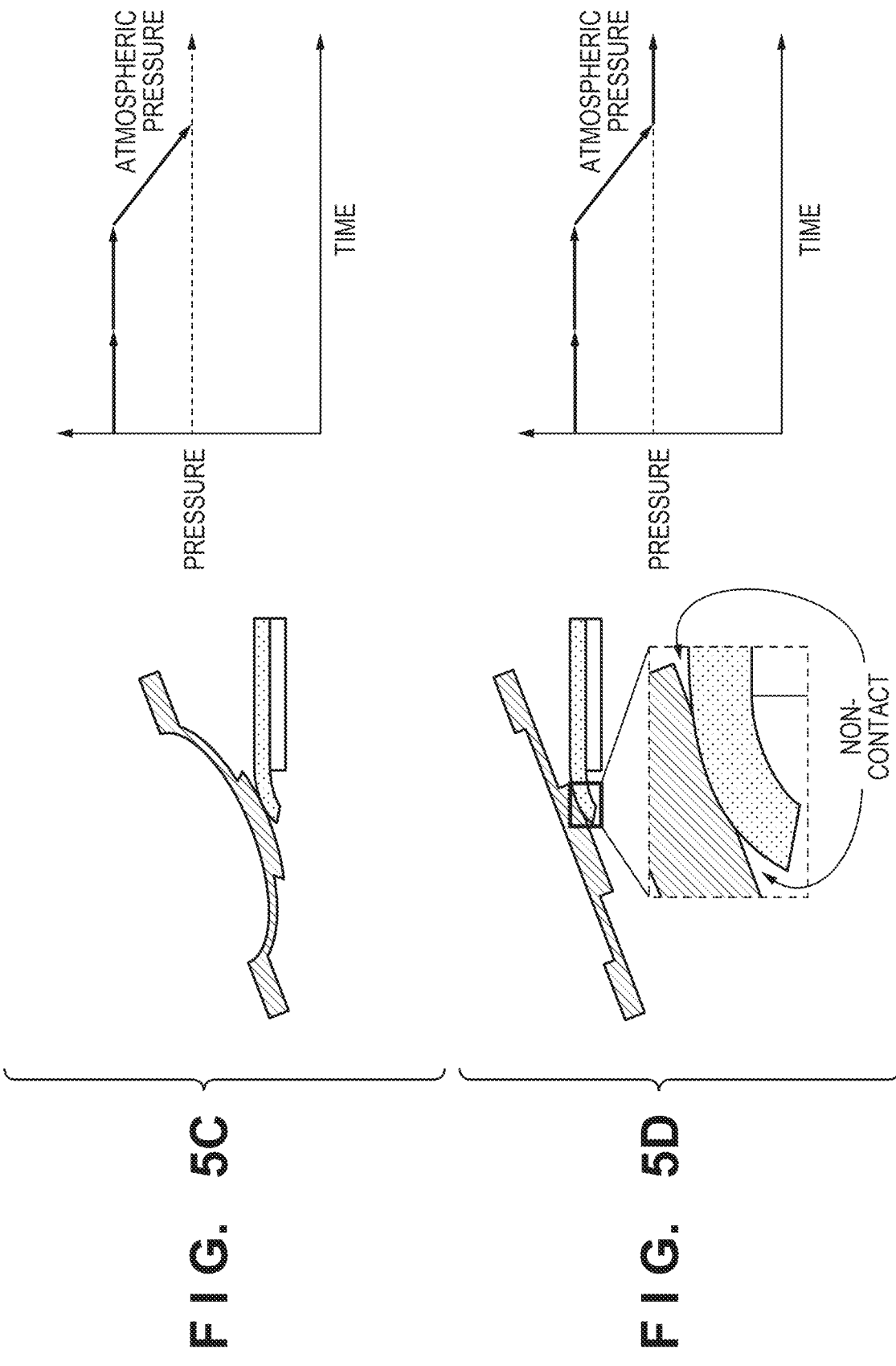

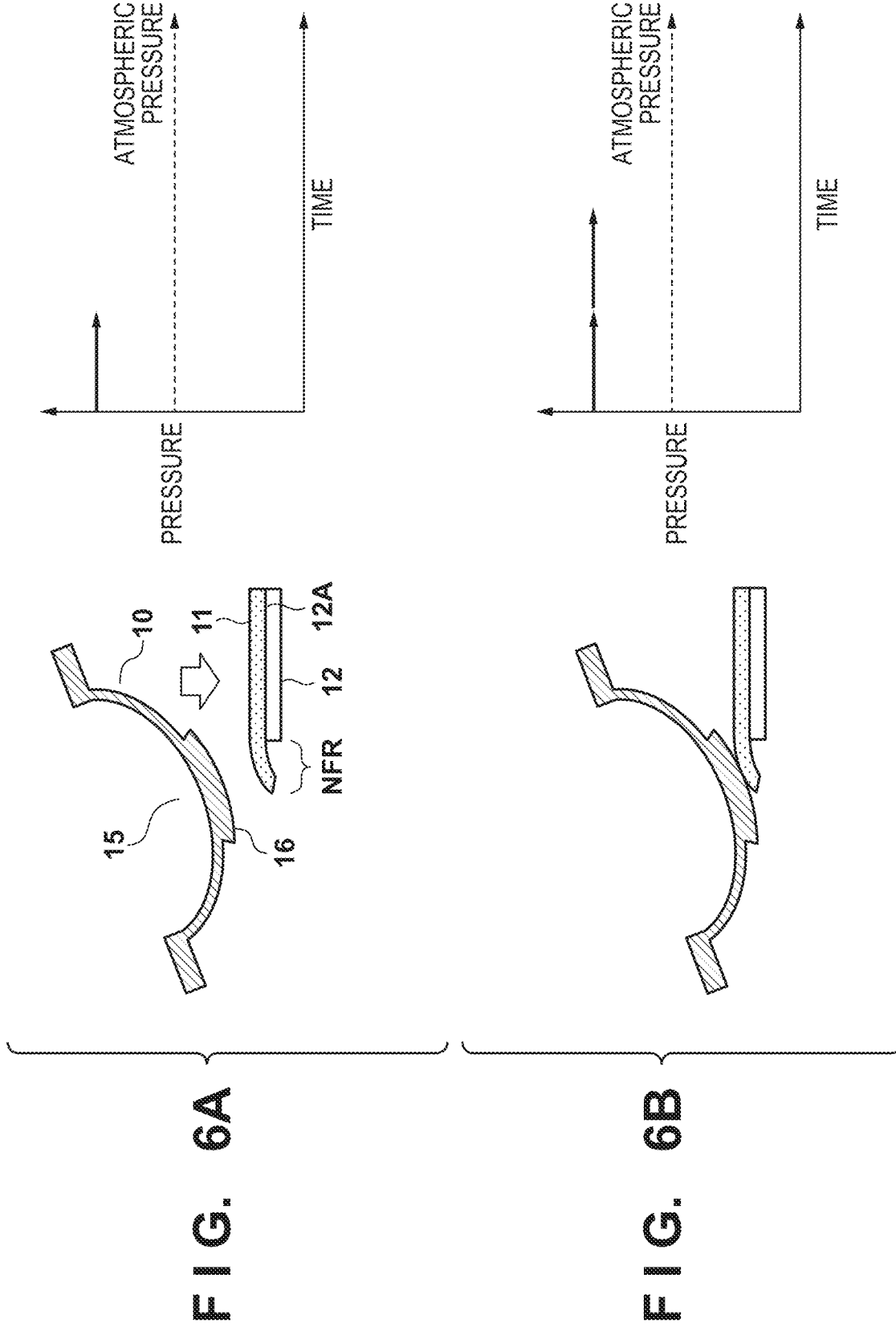

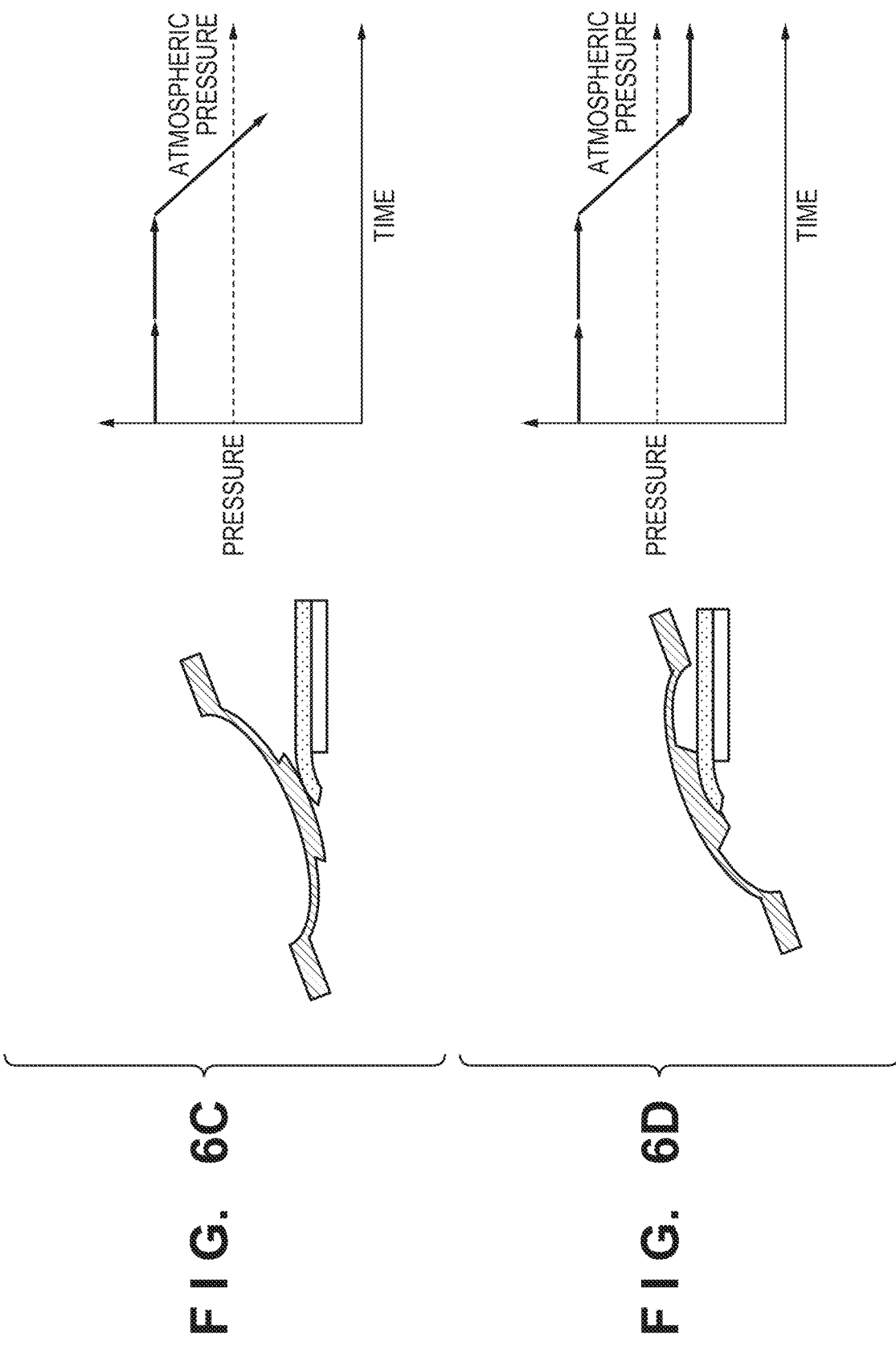

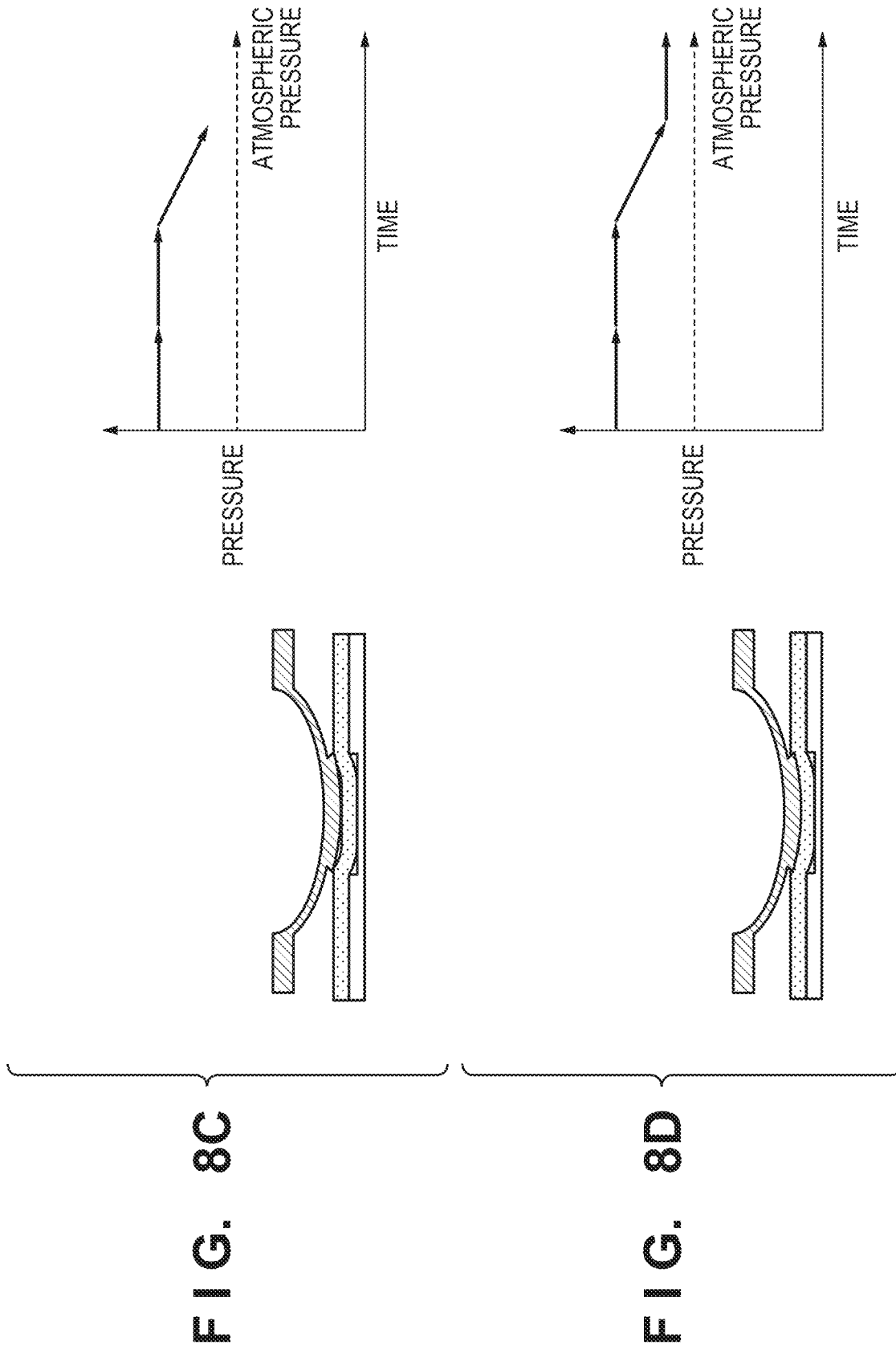

F I G.  9A
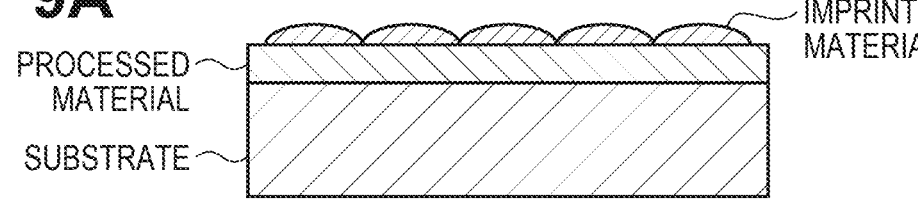
PROCESSED
MATERIAL
SUBSTRATE
IMPRINT
MATERIAL
F I G.  9B
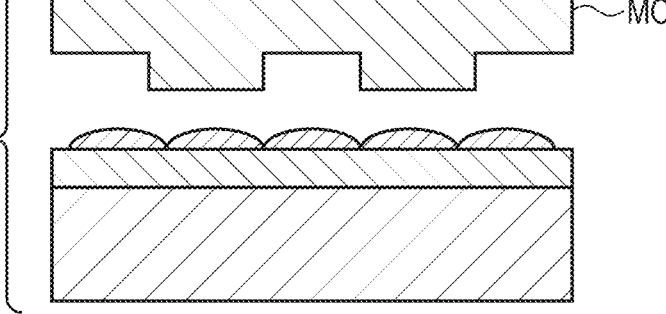
MOLD
F I G.  9C
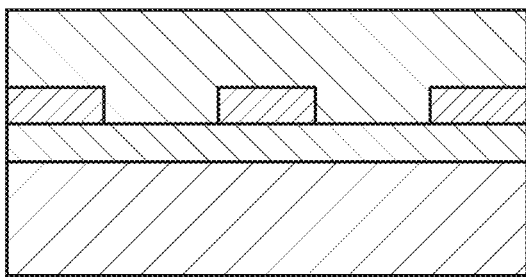
F I G.  9D
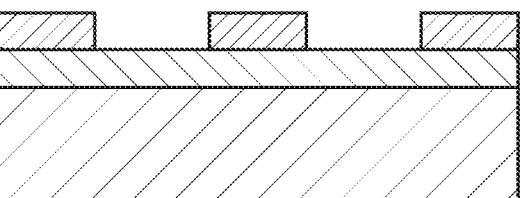
F I G.  9E
GROOVE
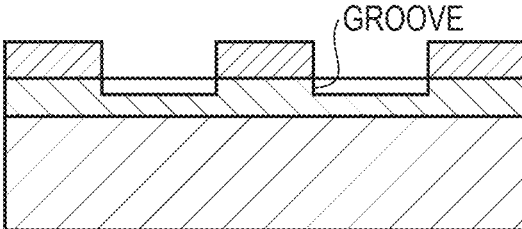
F I G.  9F
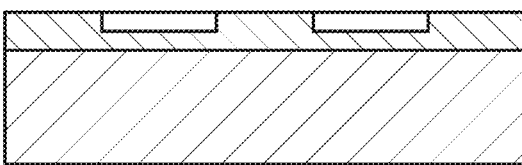

IMPRINT APPARATUS, IMPRINT METHOD AND ARTICLE MANUFACTURING METHOD

BACKGROUND OF THE INVENTION

Field of the Invention

The present invention relates to an imprint apparatus, an imprint method and an article manufacturing method.

Description of the Related Art

An imprint apparatus cures an imprint material in a state in which a mold bearing a pattern and the imprint material on a substrate contact each other, and then the mold is released from the cured imprint material, thereby forming the pattern on the substrate. Japanese Patent No. 5543502 discloses that when a mold and an imprint material on a substrate are brought into contact with each other, (the surface shape of) the mold conforms to the groove/projection (surface shape) of the substrate and the thickness of the imprint material on the substrate is uniformed by the fluid pressure of the imprint material present between the mold and the substrate.

A substrate to be processed in an imprint apparatus is sometimes deformed into a concave shape or a convex shape as a whole (as an entire substrate) owing to the membrane stress during the manufacturing process. In the imprint apparatus, a substrate is held (fixed) by a substrate holding unit so that the substrate becomes flat, but the periphery of the substrate may not be held satisfactorily and the shape of the substrate may remain unchanged. In some cases, the substrate holding unit intentionally holds the substrate so as to deform it into a predetermined concave or convex shape. Even in this case, the imprint apparatus needs to perform imprint processing on the substrate held by the substrate holding unit to form the pattern of an imprint material on the substrate using a mold.

For example, a case where a 3-mm range inward from the outer edge of a substrate is defined as a periphery, and the periphery is not held by the substrate holding unit and droops by its own weight (entire substrate deforms into a convex shape) will be considered. In this case, when imprint processing is performed using a mold having a 30 mm×30 mm-angle of view (pattern surface), no sufficient force is applied to the periphery of the substrate, and a pattern formed on the substrate becomes a failure.

Japanese Patent No. 5543502 discloses that a mold can be conformed to a local groove/projection within a substrate by the fluid pressure of an imprint material. However, the present inventor has found that the fluid pressure of an imprint material is insufficient for conforming a mold to the surface shape of a substrate for each angle of view (pattern surface).

SUMMARY OF THE INVENTION

The present invention provides a technique advantageous in forming the pattern of an imprint material on a substrate.

According to one aspect of the present invention, there is provided an imprint apparatus that forms a pattern of an imprint material in each of a plurality of shot regions of a substrate using a mold, the apparatus including a mold holding unit configured to hold the mold, a deformation unit configured to deform a pattern surface of the mold by adjusting a pressure of a closed space defined between a surface of the mold opposite to the pattern surface and the mold holding unit in a state in which the mold is held by the mold holding unit, and a control unit configured to control a shape of the pattern surface by adjusting the pressure of the closed space by the deformation unit in accordance with a position of the shot region to make the shape of the pattern surface conform to a surface shape of the shot region when forming the pattern in each of the plurality of shot regions.

Further aspects of the present invention will become apparent from the following description of exemplary embodiments with reference to the attached drawings.

BRIEF DESCRIPTION OF THE DRAWINGS

FIGS. 4A to 4D are views for describing transition of the pressure of an air-chamber in imprint processing with respect to a full shot region in a comparative example.

FIGS. 5A to 5D are views for describing transition of the pressure of the air-chamber in imprint processing with respect to a partial shot region in the comparative example.

FIGS. 6A to 6D are views for describing transition of the pressure of the air-chamber in imprint processing with respect to a partial shot region in the first example.

FIGS. 8A to 8D are views for describing transition of the pressure of the air-chamber in imprint processing with respect to a full shot region in the second example.

FIGS. 9A to 9F are views for describing an article manufacturing method.

DESCRIPTION OF THE EMBODIMENTS

Figure 1:
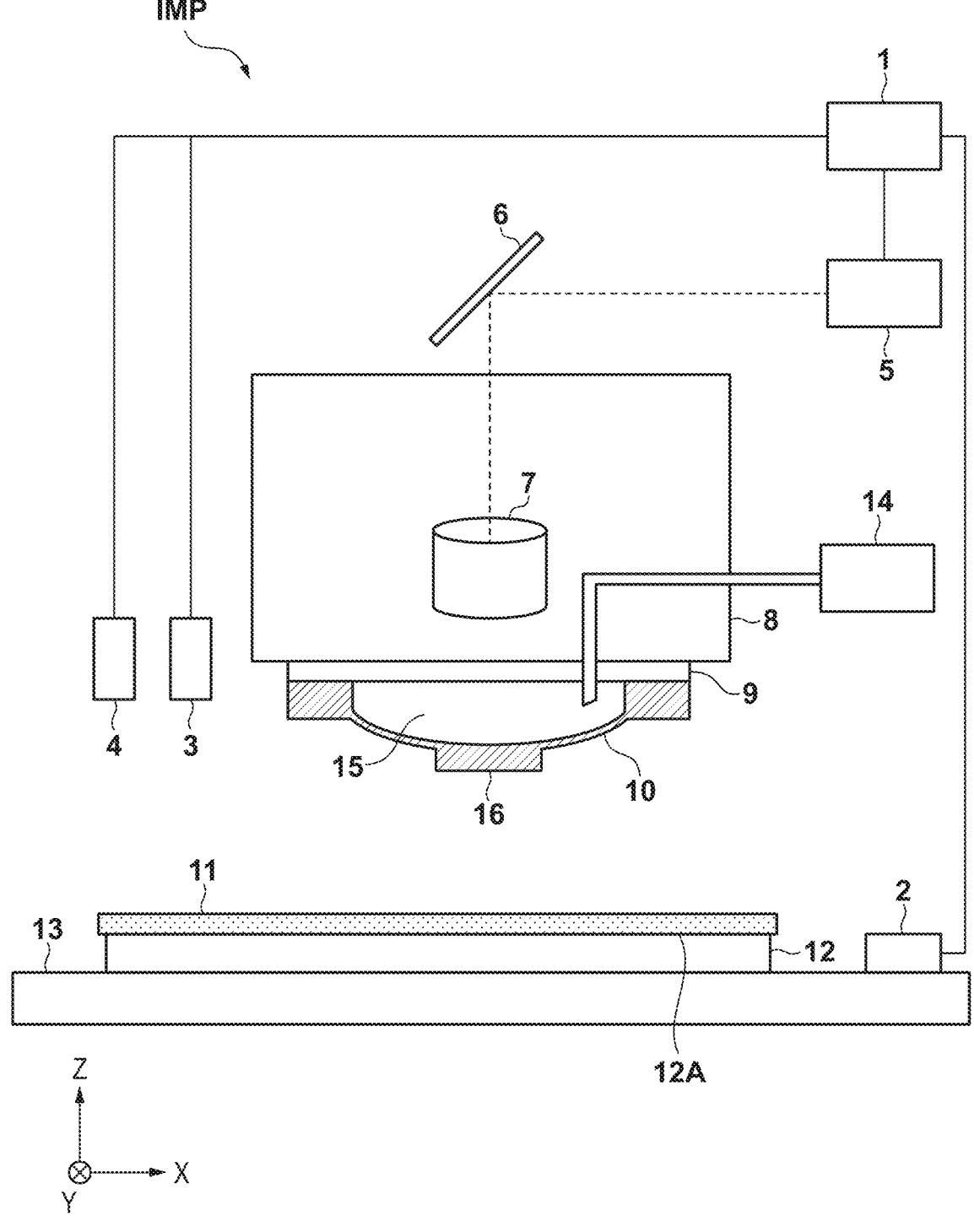
FIG. 1 is a schematic view illustrating configurations of an imprint apparatus according to an aspect of the present invention.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate.

Furthermore, in the attached drawings, the same reference numerals are given to the same or similar configurations, and redundant description thereof is omitted.

FIG. 1 is a schematic view illustrating configurations of an imprint apparatus IMP according to an aspect of the present invention. The imprint apparatus IMP is a lithography apparatus employed in a lithography step that is a manufacturing step for a device such as a semiconductor element, a liquid crystal display element, or magnetic storage medium to form a pattern on a substrate. The imprint apparatus IMP forms a pattern of an imprint material on a substrate by molding the imprint material (viscous material) on the substrate using a mold. In the embodiment, the imprint apparatus IMP brings an imprint material arranged (supplied) on the substrate into contact with the mold, and applies curing energy to the imprint material, thereby forming a pattern of a cured product to which the pattern of the mold is transferred.

As the imprint material, a material (curable composition) to be cured by receiving curing energy is used. An example of the curing energy that is used is electromagnetic waves, heat, or the like. As the electromagnetic waves, for example, infrared light, visible light, ultraviolet light, and the like selected from the wavelength range of 10 nm (inclusive) to 1 mm (inclusive) is used.

The curable composition is a composition cured by light irradiation or heating. The photo-curable composition cured by light irradiation contains at least a polymerizable compound and a photopolymerization initiator, and may contain a nonpolymerizable compound or a solvent, as needed. The nonpolymerizable compound is at least one type of material selected from a group comprising of a sensitizer, a hydrogen donor, an internal mold release agent, a surfactant, an antioxidant, a polymer component, and the like.

The imprint material may be applied in a film shape onto the substrate by a spin coater or a slit coater. The imprint material may be applied, onto the substrate, in a droplet shape or in an island or film shape formed by connecting a plurality of droplets using a liquid injection head. The viscosity (the viscosity at 25° C.) of the imprint material is, for example, 1 mPa-s (inclusive) to 100 mPa-s (inclusive).

As the substrate, glass, ceramic, a metal, a semiconductor, a resin, or the like is used, and a member made of a material different from that of the substrate may be formed on the surface of the substrate, as needed. More specifically, examples of the substrate include a silicon wafer, a semi-conductor compound wafer, silica glass, and the like.

In the specification and the accompanying drawings, directions will be indicated on an XYZ coordinate system in which directions parallel to a plane on which the substrate is placed are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are $\theta$X, $\theta$Y, and $\theta$Z, respectively.

Control or driving about the X-axis, the Y-axis, and the Z-axis means control or driving regarding a direction parallel to the X-axis, a direction parallel to the Y-axis, and a direction parallel to the Z-axis. Also, control or driving about the $\theta$X-axis, the $\theta$Y-axis, and the $\theta$Z-axis means control or driving regarding a rotation about an axis parallel to the X-axis, a rotation about an axis parallel to the Y-axis, and a rotation about an axis parallel to the Z-axis. A position is information specified based on the coordinates of the X-axis, the Y-axis, and the Z-axis, and a posture is infor-mation specified by the values of the $\theta$X-axis, the $\theta$Y-axis, and the $\theta$Z-axis. Positioning means control (correction or change) of the position and/or the posture. Alignment includes control (correction or change) of the position, posture, and/or shape of at least one of a substrate and a mold.

As shown in FIG. 1, the imprint apparatus IMP includes a substrate holding unit 12, a substrate driving unit 13 that drives the substrate holding unit 12 (a substrate 11), and a position measurement unit 4 that measures the position (positions in the X and Y directions) of the substrate 11 held by the substrate holding unit 12. The substrate holding unit 12 holds the substrate 11 on a substrate holding surface 12A. In the embodiment, the substrate holding surface 12A is constituted to be smaller in size (area) than the substrate 11. Thus, the substrate 11 is held by the substrate holding unit 12 so that its periphery (for example, a 3-mm outermost region inward from the outer edge of the substrate 11) protrudes outward from the substrate holding surface 12A.

The imprint apparatus IMP further includes a mold hold-ing unit 9 that holds a mold 10, and a mold driving unit 8 that drives the mold holding unit 9 (mold 10). Note that the mold 10 includes a pattern surface 16 on which a pattern to be transferred to the substrate 11 is formed.

The substrate driving unit 13 and the mold driving unit 8 constitute a driving mechanism that drives at least one of the substrate 11 and the mold 10 about the six, X-axis, Y-axis, Z-axis, $\theta$X-axis, $\theta$Y-axis, and $\theta$Z-axis so as to adjust the relative positions and/or postures of the substrate 11 and (the pattern surface 16 of) the mold 10. Adjustment of the relative positions of the substrate 11 and the mold 10 by the driving mechanism includes driving for bringing an imprint material on the substrate and the mold 10 into contact with each other (pressing the mold 10 against the imprint material on the substrate), and driving for releasing the mold 10 from the cured imprint material on the substrate.

The substrate driving unit 13 drives the substrate holding unit 12 so as to drive the substrate 11 about a plurality of axes (for example, three, X-axis, Y-axis, and $\theta$Z-axis, pref-erably, six X-axis, Y-axis, Z-axis, $\theta$X-axis, $\theta$Y-axis, and $\theta$Z-axis). The mold driving unit 8 drives the mold holding unit 9 so as to drive the mold 10 about a plurality of axes (for example, three, Z-axis, $\theta$X-axis, and $\theta$Y-axis, preferably, six X-axis, Y-axis, Z-axis, $\theta$X-axis, $\theta$Y-axis, and $\theta$Z-axis).

Figure 2:
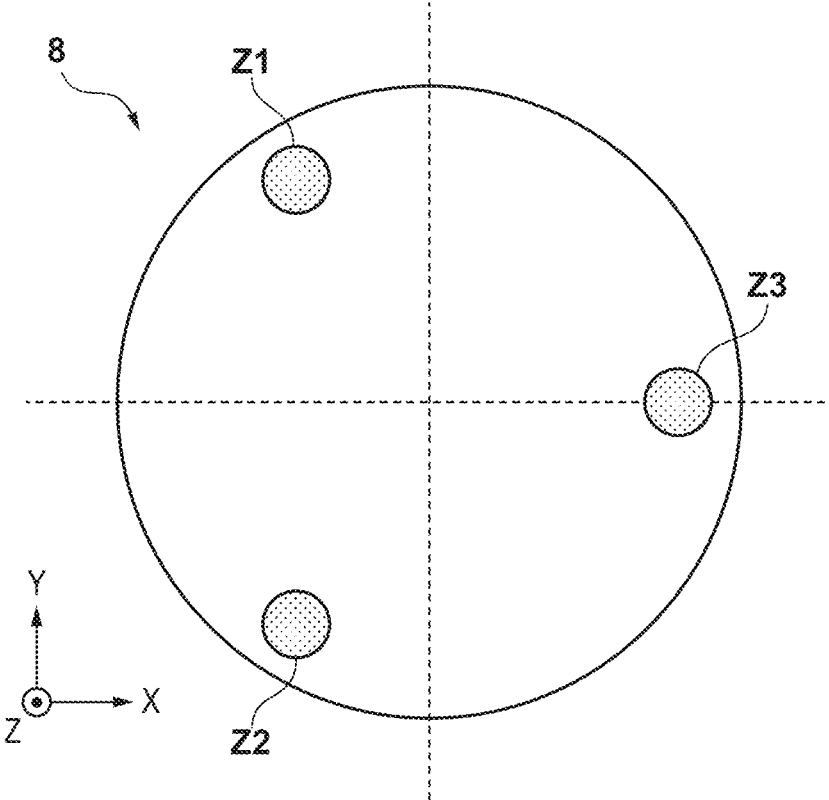
FIG. 2 is a view illustrating an example of a detailed configuration of a mold driving unit.

FIG. 2 is a view illustrating an example of a detailed configuration of the mold driving unit 8. As shown in FIG. 2, the mold driving unit 8 includes three driving systems Z1, Z2, and Z3 that drive the mold holding unit 9 in the Z direction. The driving systems Z1, Z2, and Z3 are consti-tuted by, for example, actuators independently drivable in the Z direction. Each of the driving systems Z1, Z2, and Z3 includes a sensor that detects a position in the Z direction and a force acting in the Z direction, and is driven under the control of a control unit 1 based on the output (detection result) of the sensor. This can control (adjust) the position of the mold 10 and the force applied to the mold 10.

For example, the mold 10 held by the mold holding unit 9 can be tilted in the +X direction by driving (pushing) the mold holding unit 9 toward the substrate side (–Z direction) by the driving systems Z1 and Z2 and driving the mold holding unit 9 toward a side (+Z direction) opposite to the substrate 11 by the driving system Z3. In this manner, the driving systems Z1, Z2, and Z3 (mold driving unit 8) can control the tilt (posture) of (the pattern surface 16 of) the mold 10 and implement, for example, posture control of the mold 10 in accordance with the tilt and/or shape (in-plane shape) of the substrate 11.

As shown in FIG. 1, the imprint apparatus IMP further includes a deformation unit 14, a light source 5, a beam splitter 6, a relay optical system 7, a mold measurement unit 2, a substrate measurement unit 3, and the control unit 1.

The deformation unit 14 has a function of deforming the mold 10 held by the mold holding unit 9, particularly, the pattern surface 16 of the mold 10 into a convex shape toward the substrate 11 or a concave shape toward the substrate 11. The deformation unit 14 deforms the pattern surface 16 of the mold 10 by applying a force to a surface (back surface) of the mold 10 opposite to the pattern surface 16 (surface on which a pattern is formed).

In the embodiment, the deformation unit 14 includes a pressure adjustment mechanism that adjusts the pressure of an air-chamber 15 defined (formed) between (a groove provided on) the back surface of the mold 10 and the mold holding unit 9 in a state in which the mold 10 is held by the mold holding unit 9. The air-chamber 15 is a closed space also called a cavity or a core-out, and is constituted as such a cylindrical dent structure as to cover the pattern surface 16. Note that the mold holding unit 9 may include a seal member such as seal glass for defining the air-chamber 15 on the back surface side of the mold 10. Adjusting the pressure of the air-chamber 15 is equivalent to adjusting a force applied to the back surface (groove) of the mold 10. By adjusting the pressure of the air-chamber 15, the pattern surface 16 of the mold 10 held by the mold holding unit 9 can be deformed. For example, the pattern surface 16 of the mold 10 can be deformed into a convex shape toward the substrate by adjusting the pressure of the air-chamber 15 to be higher than atmospheric pressure. In this way, the deformation unit 14 continuously deforms the pattern surface 16 of the mold 10 into a convex shape or a concave shape toward the substrate by adjusting the pressure of the air-chamber 15 to a positive pressure or a negative pressure with respect to the external pressure (atmospheric pressure) around the air-chamber 15.

The light source 5, the beam splitter 6, and the relay optical system 7 function as a curing unit that cures an imprint material by applying curing energy to the imprint material on a substrate. The light source 5 irradiates the imprint material on the substrate with light (for example, ultraviolet light) via the beam splitter 6 and the relay optical system 7, thereby curing the imprint material.

The mold measurement unit 2 has a function of obtaining (measuring) the surface of the mold 10, more specifically, the shape of the pattern surface 16 of the mold 10. In the embodiment, the mold measurement unit 2 includes a sensor that is provided below the mold 10 and can measure a distance. The mold measurement unit 2 obtains the shape of the pattern surface 16 by measuring heights (distances to a plurality of positions) of the pattern surface 16 of the mold 10 at a plurality of positions.

The substrate measurement unit 3 has a function of obtaining (measuring) the shape of the surface of the substrate 11. In the embodiment, the substrate measurement unit 3 includes a sensor that is provided above the substrate 11 and can measure a distance. The substrate measurement unit 3 obtains the shape of the surface of the substrate 11 by measuring heights (distances to a plurality of positions) of the surface of the substrate 11 at a plurality of positions.

The control unit 1 is constituted by an information processing apparatus (computer) including a CPU, a memory, and the like. The control unit 1 operates the imprint apparatus IMP by comprehensively controlling the respective units of the imprint apparatus IMP in accordance with a program stored in a storage. The control unit 1 controls imprint processing of forming a pattern from the cured product of an imprint material on a substrate using the mold 10.

The imprint apparatus IMP may include a dispenser (not shown) that arranges (supplies) an imprint material on a substrate. The dispenser arranges the imprint material in each shot region of the substrate 11 by, for example, discharging (a droplet of) the imprint material to each shot region of the substrate 11. The dispenser may arrange the imprint material in each of shot regions among the plurality of shot regions of the substrate 11 or arrange the imprint material in some shot regions at once. Instead of providing the dispenser in the imprint apparatus IMP, the substrate 11 on which the imprint material is arranged by an external apparatus (for example, a spin coater) other than the imprint apparatus IMP may be loaded into the imprint apparatus IMP.

Imprint processing performed under the control of the control unit 1 in the imprint apparatus IMP will be explained.

First, the substrate driving unit 13 drives the substrate holding unit 12 holding the substrate 11 so that a shot region bearing an imprint material is positioned below the mold 10. Then, the mold driving unit 8 drives the mold holding unit 9 holding the mold 10 toward the substrate 11 (–Z direction) to bring the mold 10 into contact with the imprint material in the shot region of the substrate 11 (sandwich the imprint material between the mold 10 and the substrate 11). The step until the mold 10 and the imprint material on the substrate are brought into contact with each other after the substrate 11 is driven to below the mold 10 will be called a contact (liquid contact) step.

In the embodiment, when bringing the imprint material on the substrate and the mold 10 into contact with each other, the mold holding unit 9 is driven toward the substrate 11. Instead of driving the mold holding unit 9, the substrate holding unit 12 may be driven toward the mold 10 (+Z direction). The imprint material on the substrate and the mold 10 may be brought into contact with each other by relatively driving both the mold holding unit 9 and the substrate holding unit 12.

In the contact step, the deformation unit 14 adjusts the pressure of the air-chamber 15 defined between the back surface of the mold 10 and the mold holding unit 9 to deform the pattern surface 16 of the mold 10 into a convex shape toward the substrate 11. When bringing the pattern surface 16 of the mold 10 into contact with the imprint material on the substrate, a gas present between the mold 10 (pattern surface 16) and the substrate 11 is pushed out to reduce a gas (air bubble mixed in the imprint material) entering the imprint material on the substrate.

Note that in the contact step, for a partial shot region of the substrate 11, the deformation unit 14 sometimes deforms the pattern surface 16 of the mold 10 into a concave shape toward the substrate 11 by adjusting the pressure of the air-chamber 15 defined between the back surface of the mold 10 and the mold holding unit 9. In other words, for a partial shot region of the substrate 11, the deformation unit 14 sometimes deforms the pattern surface 16 of the mold 10 into a convex shape toward the mold holding unit 9. In the embodiment, a case where the pattern surface 16 of the mold 10 is deformed into a convex shape toward the substrate 11 even for a partial shot region will be explained. However, a similar concept is applied to even a case where the pattern surface 16 of the mold 10 is deformed into a concave shape toward the substrate 11. Note that the partial shot region is also called an imperfect shot region, and is a shot region including the outer edge of the substrate 11 and having an area smaller than that of the pattern surface 16 of the mold 10.

In the embodiment, a convex shape or a concave shape on the mold 10 or the pattern surface 16 of the mold 10 means a shape (curve of a two-dimensional shape) obtained by deformation by the deformation unit 14, and does not mean a pattern shape (groove/projection) formed on the pattern surface 16.

After the mold 10 is brought into contact with the imprint material on the substrate, driving of the mold holding unit 9 holding the mold 10 toward the substrate 11 (–Z direction) by the mold driving unit 8 continues to spread the imprint material all over the pattern surface 16 of the mold 10 (to spread the contact area between the mold 10 and the imprint material). This driving may be performed by position control based on the distance between the mold 10 and the substrate 11 or by force control based on a force acting on the mold 10.

The imprint apparatus IMP forms the pattern of an imprint material on a substrate by sandwiching the imprint material between the pattern surface 16 of the mold 10 and the substrate 11. After bringing the mold 10 into contact with the imprint material on the substrate, pressure adjustment of the air-chamber 15 by the deformation unit 14 and driving of the mold holding unit 9 by the mold driving unit 8 are performed simultaneously until the imprint material spreads all over the pattern surface 16 of the mold 10. The step until the imprint material is spread all over the pattern surface 16 of the mold 10 after the mold 10 is brought into contact with the imprint material on the substrate will be called an imprint step.

After the imprint material on the substrate spreads all over the pattern surface 16 of the mold 10, (the pattern surface 16 of) the mold 10 and (the shot region of) the substrate 11 are aligned, and the pattern surface 16 of the mold 10 is filled with the imprint material. At this time, a shape to which the pattern surface 16 of the mold 10 is deformed by the deformation unit 14 is decided in terms of improving the alignment precision. The step until curing energy is applied to the imprint material after the imprint material is spread all over the pattern surface 16 of the mold 10 will be called a filling step.

After the mold 10 and the substrate 11 are aligned and the pattern surface 16 of the mold 10 is filled with the imprint material, the curing unit cures the imprint material by applying curing energy to the imprint material between the pattern surface 16 of the mold 10 and the substrate 11. The step of curing the imprint material (imprint material on the substrate) filling the pattern surface 16 of the mold 10 will be called a curing (exposure) step.

After the imprint material on the substrate is cured, the mold driving unit 8 drives the mold holding unit 9 holding the mold 10 to a side (+Z direction) opposite to the substrate 11, thereby releasing the mold 10 from the cured imprint material on the substrate. As a result, a pattern formed from the cured product of the imprint material is formed in the shot region of the substrate 11. The step until the mold 10 is released after the imprint material on the substrate is cured will be called a mold release step.

Imprint processing including the contact step, the imprint step, the filling step, the curing step, and the mold release step is performed sequentially in respective shot regions of the substrate 11. After the imprint processing is performed in all the shot regions of the substrate 11, the substrate 11 is unloaded from the imprint apparatus IMP (substrate holding unit 12).

Comparative Example

Figure 3:
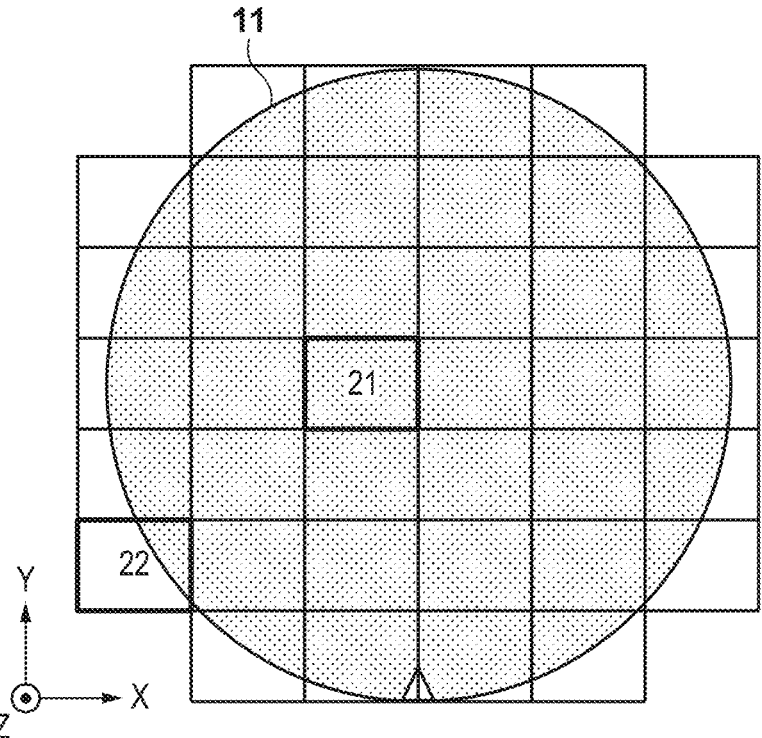
FIG. 3 is a view illustrating the array of a plurality of shot regions on a substrate.

As a comparative example, transition of the pressure of an air-chamber 15 that is adjusted by a deformation unit 14 under the control of a control unit 1 in the contact step, imprint step, and filling step of general imprint processing will be explained. A plurality of shot regions of a substrate 11 are basically classified into two types and as shown in FIG. 3, include full shot regions 21 having the same area as that of a pattern surface 16 of a mold 10 and partial shot regions 22 as described above. First, transition of the pressure of the air-chamber 15 in general imprint processing (contact step, imprint step, and filling step) with respect to the full shot region 21 will be explained with reference to FIGS. 4A to 4D.

FIG. 4A illustrates the state of the mold 10 and the pressure of the air-chamber 15 in the contact step as a schematic view and a graph, respectively. In the graph shown in FIG. 4A, the ordinate represents the pressure (pressure value) of the air-chamber 15, and the abscissa represents the time. In the contact step, (the pattern surface 16 of) the mold 10 takes a posture facing straight the substrate 11 or a posture aligned (posture adjusted for alignment) with respect to the substrate 11. The deformation unit 14 adjusts the pressure of the air-chamber 15 to be a positive pressure with respect to atmospheric pressure, more specifically, to be a maximum pressure as long as the mold 10 does not slip off the mold holding unit 9, in order to prevent entrance of a gas (air) between the mold 10 and the substrate 11.

FIG. 4B illustrates the state of the mold 10 and the pressure of the air-chamber 15 in the imprint step as a schematic view and a graph, respectively. In the graph shown in FIG. 4B, the ordinate represents the pressure (pressure value) of the air-chamber 15, and the abscissa represents the time. In the imprint step, the deformation unit 14 maintains the pressure of the air-chamber 15 at the high pressure (positive pressure with respect to atmospheric pressure) adjusted in the contact step, more specifically, at the maximum pressure. The imprint material is spread on the pattern surface 16 by controlling the driving amount (push of the mold 10 against the imprint material on the substrate) of a mold driving unit 8 toward the substrate 11 (−Z direction).

Figures 4C, 4D:
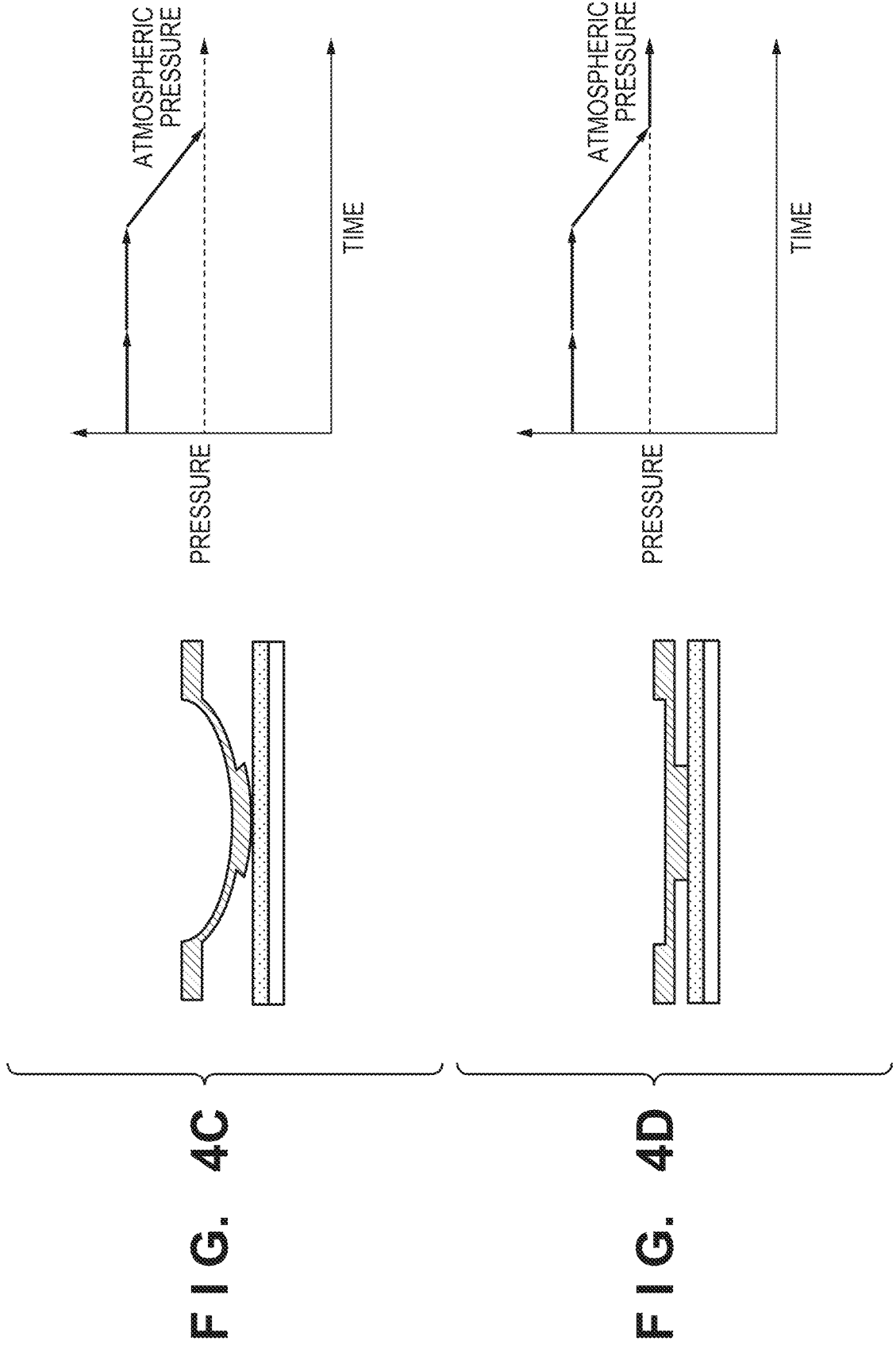

FIG. 4C illustrates the state of the mold 10 and the pressure of the air-chamber 15 during transition from the imprint step to the filling step as a schematic view and a graph, respectively. In the graph shown in FIG. 4C, the ordinate represents the pressure (pressure value) of the air-chamber 15, and the abscissa represents the time. During transition from the imprint step to the filling step, it is necessary to spread the imprint material all over the pattern surface 16 of the mold 10, and deform the mold 10 (pattern surface 16) into a shape (convex shape or concave shape) adjusted for alignment with respect to the substrate 11. Therefore, the deformation unit 14 reduces the pressure of the air-chamber 15 from the high pressure (maximum pressure) and adjusts it toward atmospheric pressure.

FIG. 4D illustrates the state of the mold 10 and the pressure of the air-chamber 15 in the filling step as a schematic view and a graph, respectively. In the graph shown in FIG. 4D, the ordinate represents the pressure (pressure value) of the air-chamber 15, and the abscissa represents the time. In the filling step, the deformation unit 14 adjusts the pressure of the air-chamber 15 to be or maintain atmospheric pressure, in order to minimize misalignment (relative positions) between the pattern surface 16 of the mold 10 and the substrate 11.

Next, transition of the pressure of the air-chamber 15 in general imprint processing (contact step, imprint step, and filling step) with respect to the partial shot region 22 will be explained with reference to FIGS. 5A to 5D.

As described above, a substrate holding unit 12 holds the substrate 11 on a substrate holding surface 12A smaller in size than the substrate 11. As shown in FIG. 5A, the periphery of the substrate 11 is not held by the substrate holding unit 12 (that is, does not face the substrate holding surface 12A), and droops toward the substrate holding unit 12 (−Z direction) and curves (is deformed). In some cases, deformation such as a warp is generated on the entire substrate owing to the membrane stress in the device manufacturing process, so the curve generated at the periphery of the substrate 11 is not limited to the droop. A region of the substrate 11 where the curve is generated because the region does not face the substrate holding surface 12A and is not held on the substrate holding surface 12A in a state in which the substrate 11 is held by the substrate holding unit 12 will be referred to as a non-facing region NFR hereinafter.

FIGS. 5A, 5B, and 5C illustrate, as schematic views and graphs respectively, states of the mold 10 and pressures of the air-chamber 15 in the contact step, in the imprint step, during transition from the imprint step to the filling step, and in the filling step. The states of the mold 10 and the pressures of the air-chamber 15 in the contact step, in the imprint step, during transition from the imprint step to the filling step, and in the filling step are similar to those in FIGS. 4A, 4B, and 4C (full shot region 21), and a detailed description thereof will not be repeated.

FIG. 5D illustrates the state of the mold 10 and the pressure of the air-chamber 15 in the filling step as a schematic view and a graph, respectively. As described above, in the filling step, the deformation unit 14 adjusts the pressure of the air-chamber 15 to be or maintain atmospheric pressure, in order to minimize misalignment between the pattern surface 16 of the mold 10 and the substrate 11, that is, in terms of the alignment precision. In the partial shot region 22, as shown in FIG. 5D, a region where the pattern of the mold 10 cannot be accurately transferred to the imprint material on the substrate is generated in the non-facing region NFR. This is because the curvature of the curve (two-dimensional shape of the droop) generated in the non-facing region NFR of the substrate 11 is greatly different from that of the shape of the pattern surface 16 deformed by the deformation unit 14 in terms of the alignment precision. In this case, a region is generated, where the shape of the pattern surface 16 of the mold 10 does not conform to the surface shape of the non-facing region NFR of the substrate 11 and no imprint material can be sandwiched between the pattern surface 16 of the mold 10 and the substrate 11. In this region, the pattern surface 16 of the mold 10 does not contact the imprint material, and the pattern of the mold 10 cannot be transferred to the imprint material.

In this fashion, a curve (droop) generated in the non-facing region NFR of the substrate 11 is not satisfactorily considered in general imprint processing, particularly in the filling step with respect to the partial shot region 22. Hence, a pattern made from the cured product of the imprint material to which the pattern of the mold 10 is transferred cannot be formed in the entire partial shot region 22.

In the embodiment, therefore, the shape of the pattern surface 16 is controlled by adjusting the pressure of the air-chamber 15 by the deformation unit 14 in accordance with the position of a shot region so that the shape of the pattern surface 16 of the mold 10 conforms to the surface shape of each shot region in imprint processing, particularly in the filling step.

First Example

As the first example, transition of the pressure of an air-chamber 15 adjusted by a deformation unit 14 under the control of a control unit 1 in the contact step, imprint step, and filling step of imprint processing according to the embodiment will be explained. Transition of the pressure of the air-chamber 15 in imprint processing (contact step, imprint step, and filling step) according to the embodiment with respect to a partial shot region 22 will be explained with respect to FIGS. 6A to 6D.

FIGS. 6A, 6B, and 6C illustrate, as schematic views and graphs respectively, states of a mold 10 and pressures of the air-chamber 15 in the contact step, in the imprint step, during transition from the imprint step to the filling step, and in the filling step. In the example, the states of the mold 10 and the pressures of the air-chamber 15 in the contact step, in the imprint step, during transition from the imprint step to the filling step, and in the filling step are similar to those in the comparative example (FIGS. 5A, 5B, and 5C), and a detailed description thereof will not be repeated.

FIG. 6D illustrates the state of the mold 10 and the pressure of the air-chamber 15 in the filling step as a schematic view and a graph, respectively. In the example, the deformation unit 14 adjusts the pressure of the air-chamber 15 in the filling step so that the shape of a pattern surface 16 of the mold 10 conforms to the surface shape (curve (two-dimensional shape of the droop) generated in a non-facing region NFR) of the non-facing region NFR of a substrate 11. More specifically, when the curve generated in the non-facing region NFR of the substrate 11 is the two-dimensional shape of the droop, the deformation unit 14 adjusts the pressure of the air-chamber 15 to be a negative pressure with respect to atmospheric pressure, thereby controlling the shape of the pattern surface 16 of the mold 10 to be a concave shape toward the substrate 11. As a result, the shape of the pattern surface 16 of the mold 10 conforms to the surface shape (curve) of the non-facing region NFR of the substrate 11, and the entire pattern surface 16 of the mold 10 comes into contact with the imprint material (the imprint material is sandwiched between the pattern surface 16 of the mold 10 and the substrate 11). In the example, a pattern made from the cured product of the imprint material to which the pattern of the mold 10 is transferred can be formed in the entire partial shot region 22.

In the example, since the curve generated in the non-facing region NFR of the substrate 11 is the two-dimensional shape of the droop, the shape of the pattern surface 16 is controlled in the filling step so that the pattern surface 16 of the mold 10 becomes a concave shape toward the substrate 11. As described above, however, the curve generated in the non-facing region NFR of the substrate 11 may be the two-dimensional shape of an upward curve owing to the membrane stress during the manufacturing process. In this case, the deformation unit 14 may adjust the pressure of the air-chamber 15 to be a positive pressure with respect to atmospheric pressure, thereby controlling the shape of the pattern surface 16 of the mold 10 to become a convex shape toward the substrate 11. For example, the pressure of the air-chamber 15 is reduced from that of the air-chamber 15 in the imprint step toward atmospheric pressure.

The surface shape of each of shot regions (full shot regions 21 and partial shot regions 22) of the substrate 11 can be obtained by a substrate measurement unit 3. The substrate measurement unit 3 functions as an obtaining unit that obtains shape information about the surface shape of each of shot regions of the substrate 11. Based on the shape information obtained by the substrate measurement unit 3, the shape of the pattern surface 16 can be controlled by adjusting the pressure of the air-chamber 15 by the deformation unit 14 so that the shape of the pattern surface 16 of the mold 10 coincides with the surface shape of the shot region. Note that the shape information is preferably obtained for each substrate loaded into an imprint apparatus IMP.

A pressure value of the air-chamber 15 necessary to make the shape of the pattern surface 16 of the mold 10 coincide with the surface shape of each shot region of the substrate 11 can be decided by, for example, trial and error (gauging method). More specifically, in the filling step, the pressure value of the air-chamber 15 may be decided in terms of the uniformity of the residual film thickness (thickness of the imprint material) of a pattern formed on the substrate and the uniformity of the dimensions of the pattern formed on the substrate while changing the pressure (pressure value) of the air-chamber 15.

It is also possible to obtain in advance sensitivity information representing the sensitivity of deformation of the pattern surface 16 of the mold 10 with respect to the pressure value of the air-chamber 15, and decide based on this information a pressure value of the air-chamber 15 necessary to make the shape of the pattern surface 16 coincide with the surface shape of each shot region of the substrate 11. More specifically, a pressure value of the air-chamber 15 at which the shape difference between the shape of the pattern surface 16 of the mold 10 and the surface shape of the shot region becomes minimum may be decided from sensitivity information, and the surface shape (shape information) of the shot region of the substrate 11 obtained by the substrate measurement unit 3. Then, the deformation unit 14 is controlled to adjust the pressure of the air-chamber 15 so that the pressure of the air-chamber 15 becomes the decided pressure value.

Figure 7:
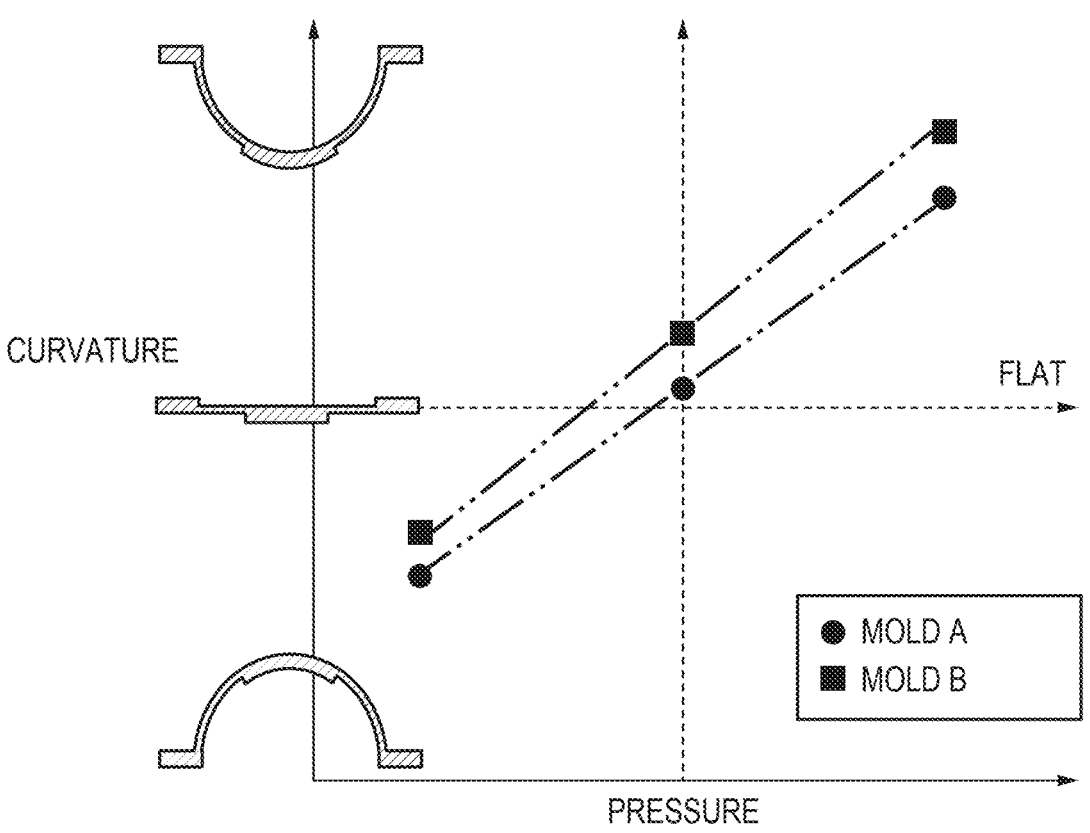
FIG. 7 is a view illustrating an example of sensitivity information representing the sensitivity of deformation of the pattern surface of the mold with respect to the pressure value of the air-chamber.

Note that the sensitivity information representing the sensitivity of deformation of the pattern surface 16 of the mold 10 with respect to the pressure value of the air-chamber 15 can be obtained in advance by, for example, measuring (a change of) the shape of the pattern surface 16 of the mold 10 by a mold measurement unit 2 while changing the pressure value of the air-chamber 15. FIG. 7 is a view illustrating an example of sensitivity information representing the sensitivity of deformation of the pattern surface 16 of the mold 10 with respect to the pressure value of the air-chamber 15. In FIG. 7, the ordinate represents the curvature (sensitivity of deformation) of the pattern surface 16 of the mold 10, and the abscissa represents the pressure value of the air-chamber 15. The sensitivity information differs depending on even the individual difference of the mold 10, and thus is preferably obtained in advance for each mold used in the imprint apparatus IMP, as shown in FIG. 7.

Before loading the substrate 11 into the imprint apparatus IMP, the shape (shape information) of each shot region of the substrate 11 is sometimes obtained in advance using a device other than the substrate measurement unit 3, for example, an atomic force microscope (AFM). In this case, a pressure value of the air-chamber 15 necessary to make the shape of the pattern surface 16 coincide with the surface shape of each shot region of the substrate 11 may be decided based on the shape of each shot region of the substrate 11 obtained by such a device.

Second Example

As the second example, transition of the pressure of an air-chamber 15 adjusted by a deformation unit 14 under the control of a control unit 1 in the contact step, imprint step, and filling step of imprint processing according to the embodiment will be explained. Transition of the pressure of the air-chamber 15 in imprint processing (contact step, imprint step, and filling step) according to the embodiment with respect to a full shot region 21 will be explained with respect to FIGS. 8A to 8D. Also, a case will be exemplified, where a groove 12B exists on a substrate holding surface 12A of a substrate holding unit 12, as shown in FIG. 8A, and when the substrate holding unit 12 holds a substrate 11 on the substrate holding surface 12A, the surface shape of a region of the substrate 11 that corresponds to the groove 12B is deformed into a concave shape.

Figures 8A, 8B:
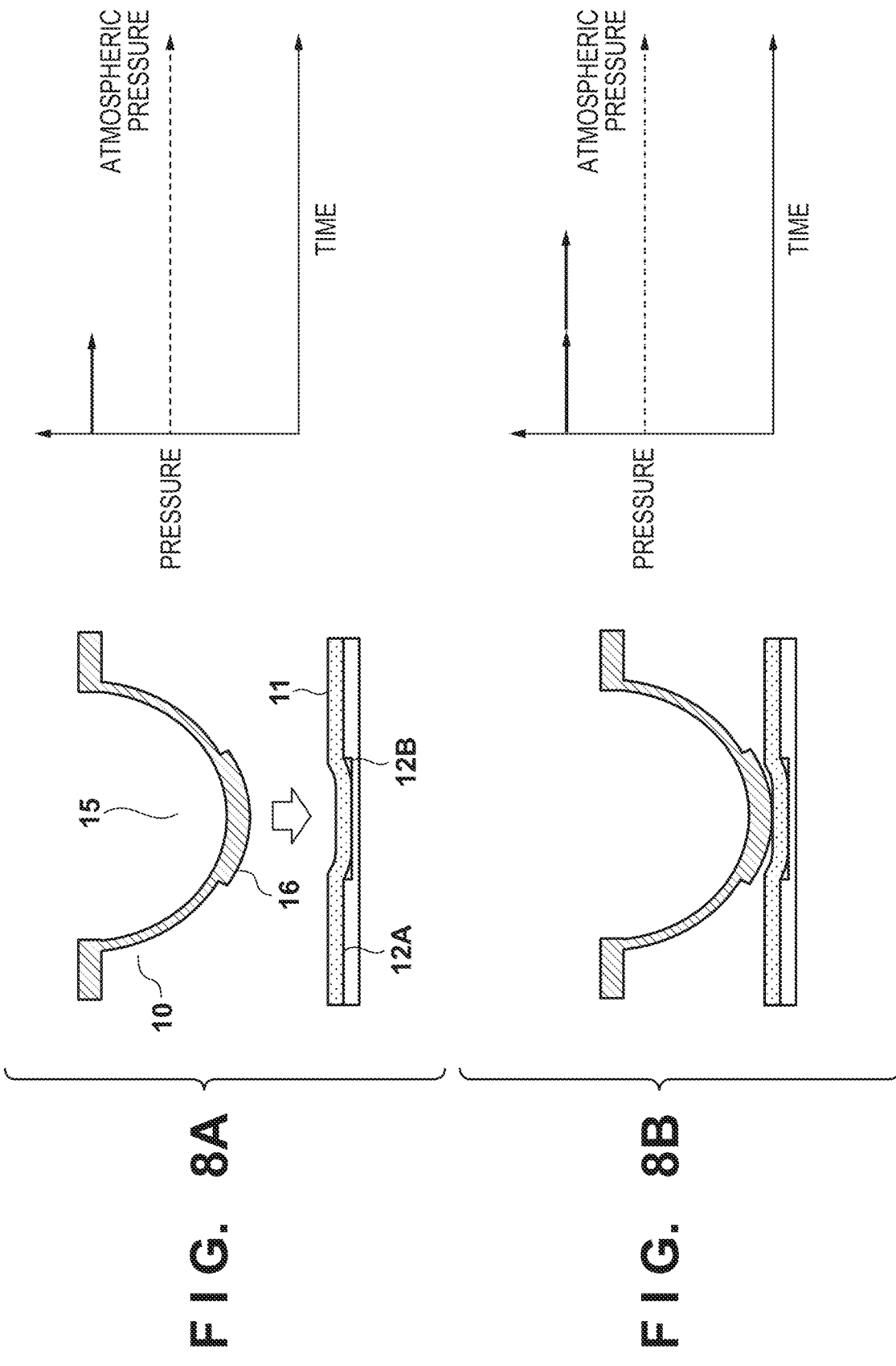

FIGS. 8A, 8B, and 8C illustrate, as schematic views and graphs respectively, states of a mold 10 and pressures of the air-chamber 15 in the contact step, in the imprint step, during transition from the imprint step to the filling step, and in the filling step. In the example, the states of the mold 10 and the pressures of the air-chamber 15 in the contact step, in the imprint step, during transition from the imprint step to the filling step, and in the filling step are similar to those in the first example (FIGS. 6A, 6B, and 6C), and a detailed description thereof will not be repeated.

FIG. 8D illustrates the state of the mold 10 and the pressure of the air-chamber 15 in the filling step as a schematic view and a graph, respectively. In the example, the shot region (full shot region 21) of the substrate 11 is curved, more specifically, deformed into a concave shape owing to the groove 12B present on the substrate holding surface 12A. If the pressure of the air-chamber 15 is adjusted to control the shape of a pattern surface 16 of the mold 10 in terms of the alignment precision (FIG. 4D), like the comparative example, the center of the pattern surface 16 floats. This generates a region where no imprint material can be sandwiched between the pattern surface 16 of the mold 10 and the substrate 11. In the example, the deformation unit 14 adjusts the pressure of the air-chamber 15 in the filling step to control the shape of the pattern surface 16 so that the shape of the pattern surface 16 of the mold 10 conforms to the surface shape of the shot region of the substrate 11 in accordance with even the shape of the substrate holding surface 12A. For example, the surface shape of the shot region in a state in which the substrate 11 is held by the substrate holding unit 12 is predicted based on the shape of the substrate holding surface 12A, and the deformation unit 14 adjusts the pressure of the air-chamber 15 so that the shape of the pattern surface 16 coincides with the predicted surface shape of the shot region. More specifically, the deformation unit 14 adjusts the pressure of the air-chamber 15 to be a positive pressure with respect to atmospheric pressure in accordance with the predicted surface shape (concave shape) of the shot region, thereby controlling the shape of the pattern surface 16 of the mold 10 to be a convex shape toward the substrate 11. Accordingly, the shape of the pattern surface 16 of the mold 10 conforms to the surface shape (curve) of the shot region of the substrate 11, and the entire pattern surface 16 of the mold 10 comes into contact with the imprint material (the imprint material is sandwiched between the pattern surface 16 of the mold 10 and the substrate 11). In the example, a pattern made from the cured product of the imprint material to which the pattern of the mold 10 is transferred can be formed in the entire partial shot region 22.

In the example, since the curve generated in the shot region of the substrate 11 is a concave shape in accordance with the shape of the substrate holding surface 12A, the shape of the pattern surface 16 is controlled in the filling step so that the pattern surface 16 of the mold 10 becomes a convex shape toward the substrate 11. When the curve generated in the shot region of the substrate 11 is a convex shape in accordance with the shape of the substrate holding surface 12A, the shape of the pattern surface 16 is controlled in the filling step so that the pattern surface 16 of the mold 10 becomes a concave shape toward the substrate 11.

Note that a substrate measurement unit 3 can obtain the shape (surface shape) of the substrate holding surface 12A of the substrate holding unit 12 by replacing the measurement target from the substrate 11 to the substrate holding surface 12A.

Third Example

The pattern of a cured product formed using the imprint apparatus IMP (imprint method) in the embodiment is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile and nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured product is directly used as the constituent member of at least some of the above-described articles or used temporarily as a resist mask. After etching or ion implantation is performed in the substrate processing step, the resist mask is removed.

Next, description regarding a detailed method of manufacturing an article is given. As illustrated in FIG. 9A, the substrate such as a silicon wafer with a processed material such as an insulator formed on the surface is prepared. Next, an imprint material is applied to the surface of the processed material by an inkjet method or the like. A state in which the imprint material is applied as a plurality of droplets onto the substrate is shown here.

As shown in FIG. 9B, a side of the mold for imprint with a projection and groove pattern is formed on and caused to face the imprint material on the substrate. As illustrated in FIG. 9C, the substrate to which the imprint material is applied is brought into contact with the mold, and a pressure is applied. The gap between the mold and the processed material is filled with the imprint material. In this state, when the imprint material is irradiated with light serving as curing energy through the mold, the imprint material is cured.

As shown in FIG. 9D, after the imprint material is cured, the mold is released from the substrate. Thus, the pattern of the cured product of the imprint material is formed on the substrate. In the pattern of the cured product, the groove of the mold corresponds to the projection of the cured product, and the projection of the mold corresponds to the groove of the cured product. That is, the projection and groove pattern of the mold is transferred to the imprint material.

As shown in FIG. 9E, when etching is performed using the pattern of the cured product as an etching resistant mask, a portion of the surface of the processed material where the cured product does not exist or remains thin is removed to form a groove. As shown in FIG. 9F, when the pattern of the cured product is removed, an article with the grooves formed in the surface of the processed material can be obtained. The pattern of the cured material is removed here, but, for example, the pattern may be used as a film for insulation between layers included in a semiconductor element or the like without being removed after processing, in other words as a constituent member of the article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent application No. 2023-091031 filed on Jun. 1, 2023, which is hereby incorporated by reference herein in its entirety.

What is claimed is:

1. An imprint apparatus that forms a pattern of an imprint material in each of a plurality of shot regions of a substrate using a mold, the apparatus comprising:
   a mold holding unit configured to hold the mold;
   a substrate holding unit configured to hold the substrate on a holding surface, wherein the holding surface is smaller in size than the substrate;
   a deformation unit configured to deform a pattern surface of the mold by adjusting a pressure of a closed space defined between a surface of the mold opposite to the pattern surface and the mold holding unit in a state in which the mold is held by the mold holding unit; and
   a control unit configured to control a shape of the pattern surface by adjusting the pressure of the closed space by the deformation unit during a contacting step and a filling step of an imprint process in accordance with a position of the shot region to make the shape of the pattern surface conform to a surface shape of the shot region when forming the pattern in each of the plurality of shot regions,
   wherein, during the contacting step, the control unit is configured to apply a positive pressure, greater than an atmospheric pressure, to the closed space to deform the shape of the pattern surface into a convex shape, and
   wherein, during the filling step, for a shot region including a non-facing region that is positioned at a periphery of the substrate and does not face the holding surface in a state in which the substrate is held by the substrate holding unit, the control unit is configured to apply a negative pressure, less than the atmospheric pressure, to the closed space to deform the shape of the pattern surface into a concave shape to make the shape of the pattern surface conform to a convex curve generated in the non-facing region by holding the substrate by the substrate holding unit.

2. The apparatus according to claim 1, further comprising an obtaining unit configured to obtain shape information about the surface shape of each of the plurality of shot regions,
   wherein the control unit is configured to control the shape of the pattern surface by adjusting the pressure of the closed space by the deformation unit to make the shape of the pattern surface conform to the surface shape of the shot region based on the shape information obtained by the obtaining unit.

3. The apparatus according to claim 2, wherein the control unit is configured to determine a pressure value of the closed space necessary to make the shape of the pattern surface coincide with the surface shape of the shot region based on sensitivity information representing a sensitivity of deformation of the pattern surface with respect to the pressure value of the closed space, and control the deformation unit to adjust the pressure of the closed space to be the determined pressure value.

4. The apparatus according to claim 1, wherein the control unit is configured to control the shape of the pattern surface by adjusting the pressure of the closed space by the deformation unit to make the shape of the pattern surface coincide with the surface shape of the shot region based on sensitivity information representing a sensitivity of deformation of the pattern surface with respect to the pressure value of the closed space.

5. The apparatus according to claim 1, wherein the control unit is configured to control the shape of the pattern surface by adjusting the pressure of the closed space by the deformation unit to make the shape of the pattern surface conform to the surface shape of the shot region in a step of filling the pattern surface with the imprint material arranged in each of the plurality of shot regions.

6. The apparatus according to claim 1, wherein the shot region including the non-facing region includes a partial shot region smaller in area than the pattern surface.

7. The apparatus according to claim 1,
wherein the control unit is configured to control the shape of the pattern surface by adjusting the pressure of the closed space by the deformation unit to make the shape of the pattern surface conform to the surface shape of the shot region in accordance with a shape of the holding surface when forming the pattern in each of the plurality of shot regions.

8. The apparatus according to claim 7, wherein the control unit is configured to predict, based on the shape of the holding surface, the surface shape of the shot region in the state in which the substrate is held by the substrate holding unit, and control the shape of the pattern surface by adjusting the pressure of the closed space by the deformation unit to make the shape of the pattern surface coincide with the predicted surface shape of the shot region.

9. The apparatus according to claim 1, wherein the deformation unit is configured to continuously deform the pattern surface to make the pattern surface have one of a convex shape and a concave shape toward the substrate.

\* \* \* \* \*